(12) United States Patent
Scott et al.

(10) Patent No.: US 10,777,517 B1
(45) Date of Patent: Sep. 15, 2020

(54) RF SWITCH

(71) Applicant: Qorvo US, Inc., Greensboro, NC (US)

(72) Inventors: Baker Scott, San Jose, CA (US);
George Maxim, Saratoga, CA (US);
Padmmasini Desikan, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/405,295

(22) Filed: May 7, 2019

(51) Int. Cl.
*H01L 23/66* (2006.01)
*H03K 17/687* (2006.01)
*H01L 21/762* (2006.01)

(52) U.S. Cl.
CPC ........ *H01L 23/66* (2013.01); *H01L 21/76243* (2013.01); *H03K 17/687* (2013.01)

(58) Field of Classification Search
CPC .. H03K 17/687; H01L 21/76243; H01L 23/66
See application file for complete search history.

(56) References Cited

U.S. PATENT DOCUMENTS

| | | | | |
|---|---|---|---|---|
| 5,950,089 A * | 9/1999 | Wen | ...................... | H01L 27/112 257/E21.672 |
| 9,536,938 B1 * | 1/2017 | Lopata | .................. | H02M 3/158 |
| 2007/0263445 A1 * | 11/2007 | Emden | .............. | H01L 27/11568 365/185.12 |
| 2014/0151795 A1 * | 6/2014 | Lotfi | ..................... | H01L 27/092 257/337 |
| 2015/0263194 A1 * | 9/2015 | Tsujimoto | ....... | H01L 31/022433 136/256 |
| 2015/0295573 A1 * | 10/2015 | Suzuki | ................ | H01L 27/0207 327/434 |
| 2016/0322345 A1 * | 11/2016 | Lee | ........................ | H01L 27/088 |
| 2018/0083002 A1 * | 3/2018 | Kim | ................... | H01L 21/76825 |
| 2019/0123166 A1 * | 4/2019 | Kanawati | .......... | H01L 29/41758 |

* cited by examiner

*Primary Examiner* — Allan R Wilson
(74) *Attorney, Agent, or Firm* — Withrow & Terranova, P.L.L.C.

(57) ABSTRACT

An apparatus with a body layer disposed over a substrate is disclosed. The body layer has first and second diffusion areas with a first current collection area between the two. A plurality of first drain/source (D/S) diffusions spaced parallel with one another resides within the first diffusion area. A plurality of first channel regions resides within the first diffusion area such that each of the plurality of first channel regions resides between an adjacent pair of the plurality of the first D/S diffusions. A plurality of second D/S diffusions resides within the second diffusion area and are spaced parallel with one another. A plurality of second channel regions reside within the second diffusion area such that each of the plurality of second channel regions resides between an adjacent pair of the plurality of the second D/S diffusions. A first current collection diffusion resides within the first current collection area.

23 Claims, 6 Drawing Sheets

RF SWITCH

FIELD OF THE DISCLOSURE

Embodiments of the present disclosure relate to semiconductor and silicon-on-insulator technologies and semiconductor-based radio frequency switches, both of which can be used in radio frequency communications circuits.

BACKGROUND

As technology progresses, wireless communications devices, such as smart phones, wireless-capable computers, or the like, are becoming increasingly integrated, feature rich, and complex. Such wireless communications devices rely on semiconductor technologies, such as silicon-based technologies, which are evolving toward smaller circuit geometries, lower power consumption, higher operating speeds, and increased complexity. Complementary metal oxide semiconductor technology is an example of a silicon-based technology. Further, wireless communications devices may need to support multiple communications bands, multiple communications modes, multiple communications protocols, and the like. As such, wireless communications devices may need multiple radio frequency (RF) switches to select between different RF circuits depending on which communications bands, modes, and protocols are in use. Such complex RF systems may place strict linearity, insertion loss, and isolation demands on the RF switches.

In general, RF switches having semiconductor-based switching elements have a trade-off between insertion loss and isolation. RF switches that must handle high power levels require low insertion losses. To achieve low insertion loss and high power handling capability, the size of circuit elements within an RF switch can be relatively large. However, such large circuit elements are associated with relatively large capacitances, which decrease isolation. Further, multiple large capacitances have non-linearities, which degrade linearity of the RF switch. In particular, the performance of an RF switch is in part related to a figure of merit that is equal to the RF switch's ON state resistance $R_{ON}$ multiplied by the RF switch's OFF state capacitance $C_{OFF}$. Thus, there is a need for an RF switch that improves the figure of merit and the trade-off between insertion loss and isolation and has improved linearity performance.

SUMMARY

A radio frequency (RF) switch having a substrate with a body layer disposed over the substrate is disclosed. The body layer has a top surface with a first diffusion area, a second diffusion area, and a first current collection area between the first diffusion area and the second diffusion area. A plurality of first drain/source (D/S) diffusions resides within the first diffusion area and each one of the plurality of first drain/source (D/S) diffusions is spaced apart from one another, parallel with one another, and elongated in an X-direction. A plurality of first channel regions resides within the first diffusion area such that each one of the plurality of first channel regions resides between an adjacent pair of the plurality of the first D/S diffusions and is elongated in the X-direction. A plurality of second D/S diffusions resides within the second diffusion area and each one of the plurality of second D/S diffusions is spaced apart from one another, parallel with one another, and elongated in the X-direction. A plurality of second channel regions resides within the second diffusion area such that each one of the plurality of second channel regions resides between an adjacent pair of the plurality of the second D/S diffusions and is elongated in the X-direction. A first current collection diffusion resides within the first current collection area and is elongated in a Y-direction, which is orthogonal to the X-direction. The first current collection diffusion is integral with both the first channel regions and the second channel regions.

In at least some embodiments, a plurality of first electrically conductive contacts is in electrical contact with and spaced along the first current collection diffusion. In these embodiments, the plurality of first electrically conductive contacts extends above the gate fingers in a Z-direction from the first current collection area, wherein the Z-direction is orthogonal to the X-direction and the Y-direction. A first metal strip is in electrical contact with the tops of the plurality of first electrically conductive contacts. The first metal strip extends elongated in the Y-direction.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
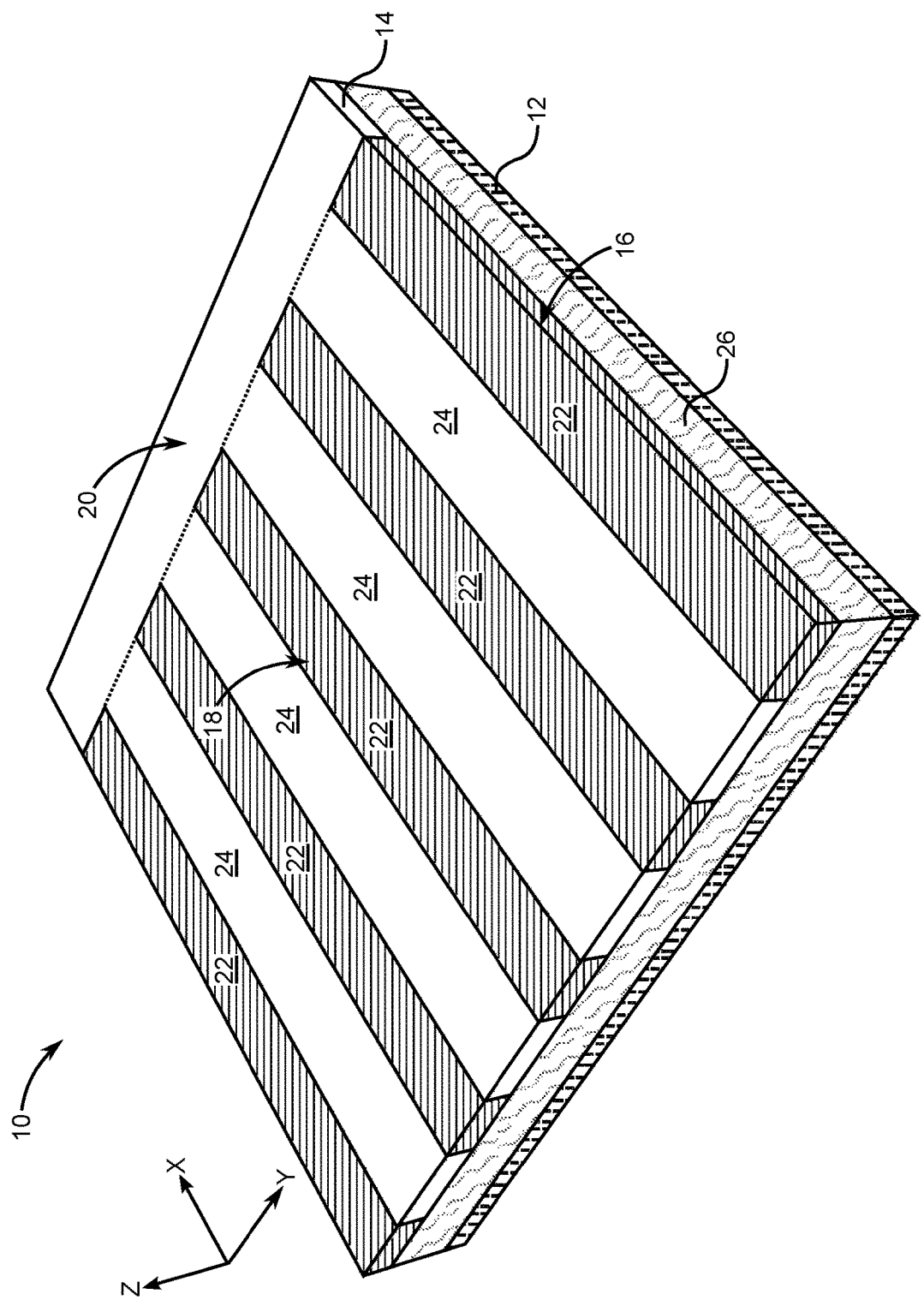
FIG. 1 is a three-dimensional (3D) sectional view of a partially completed related-art radio frequency (RF) silicon-on-insulator (SOI) switch.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a three-dimensional (3D) sectional view of a partially completed related-art radio frequency (RF) silicon-on-insulator (SOI) switch 10 that includes a substrate 12 with a body layer 14 disposed over the substrate 12. The body layer 14 has a top surface 16 with a diffusion area 18 and a current collection area 20. In FIG. 1, the diffusion area 18 and the current collection area 20 are shown separated by a dotted line. A plurality of first drain/source (D/S) diffusions 22 resides within the diffusion area 18, and each one of the plurality of first drain/source (D/S) diffusions 22 is spaced apart from one another, parallel with one another, and elongated in an X-direction. A plurality of channel regions 24 resides within the diffusion area 18 such that each one of the plurality of channel regions 24 resides between an adjacent pair of the plurality of the D/S diffusions 24 and is elongated in the X-direction. A buried oxide layer (BOX) 26 is disposed between the substrate 12 and the body layer 14. The current collection area 20 is elongated in a Y-direction that is orthogonal to the X-direction.

Figure 2:
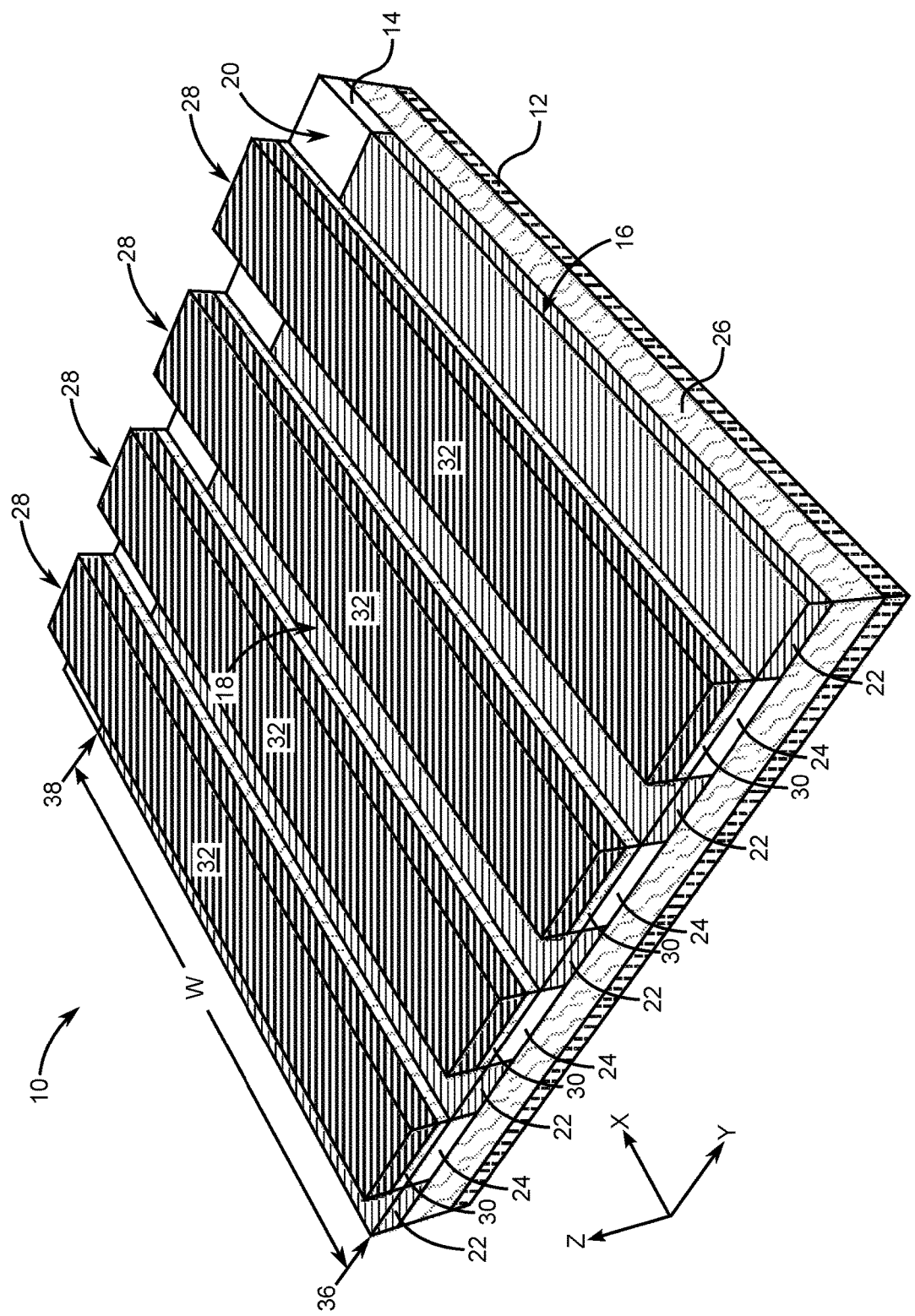
FIG. 2 is a 3D sectional view of the partially completed related-art RF SOI switch with gate structures added.

FIG. 2 is a 3D sectional view of the partially completed related-art RF SOI switch 10 with gate structures 28 added. The gate structures 28 include gate oxide strips 30 that are disposed over corresponding ones of the plurality of channel regions 24. The gate structures 28 include gate fingers 32 that are disposed over corresponding ones of the gate oxide strips 30. The gate oxide strips 30 and the gate fingers 32 extend elongated in the X-direction.

A problem exists with the related-art RF SOI switch 10 in that current paths through the plurality of channel regions 24 present higher than desired resistance values due to an undesirably long distance W between a proximal edge 36 and a distal edge 38 of the plurality of first D/S diffusions 22 and the plurality of channel regions 24. During operation, as voltage between different ones of the plurality of first D/S diffusions 22 increases, inherent body diodes (not shown) increasingly conduct avalanche current into the plurality of channel regions 24. This avalanche current interacting with the intrinsic resistance of the body layer 14 causes local voltage of the body layer 14 to reach an undesirable level, which reduces power handling of the related-art RF SOI switch 10. What is needed is an apparatus that mitigates the problems identified when avalanche current interacts with the intrinsic resistance of the body layer 14 of the related-art RF SOI switch 10.

Figure 3:
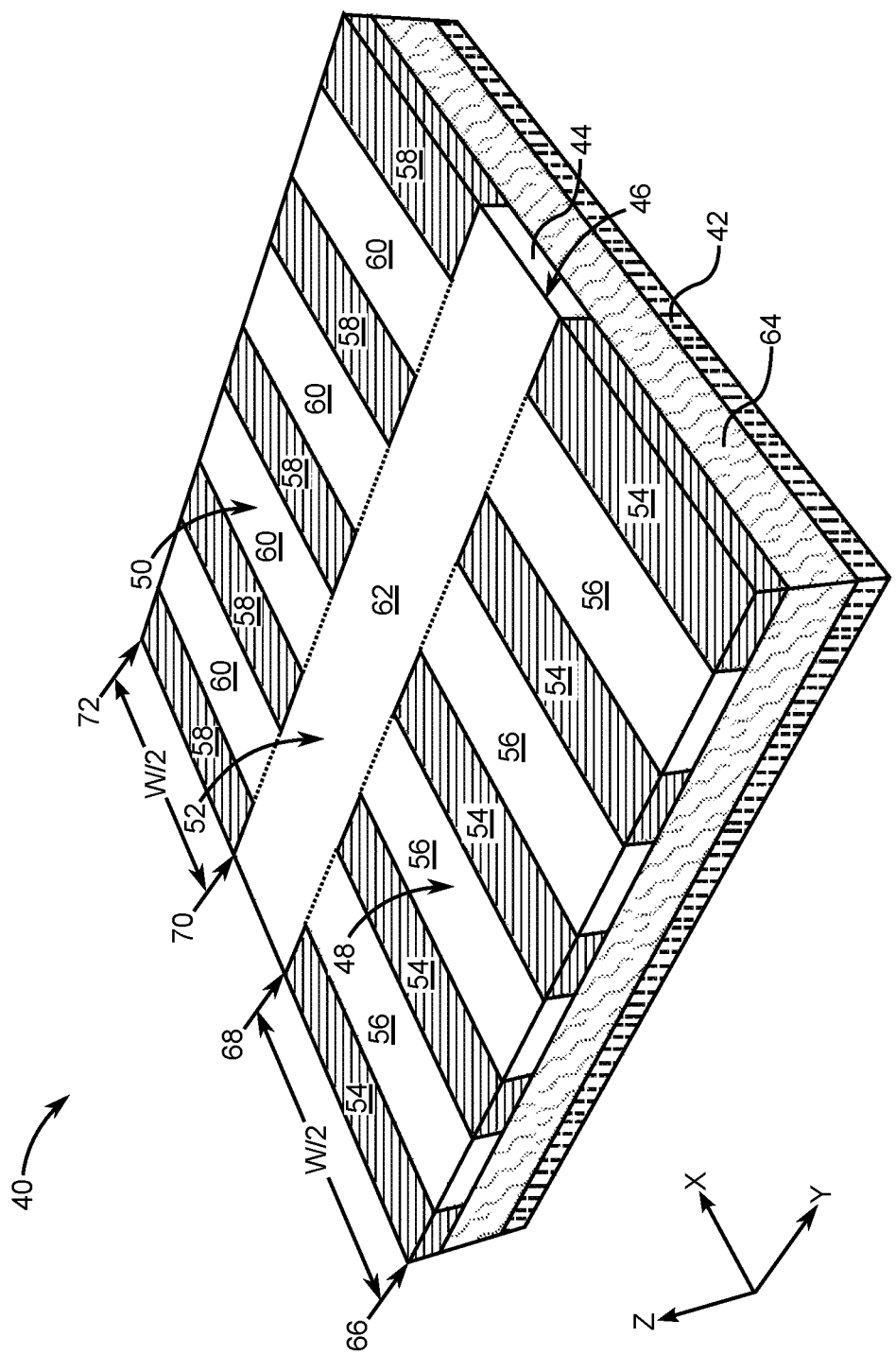
FIG. 3 is a 3D sectional view of a partially completed first embodiment of an RF switch that is structured in accordance with the present disclosure.

In this regard, FIG. 3 depicts a 3D sectional view of a partially completed first embodiment of an RF switch 40 that in accordance with the present disclosure is structured to maintain power handling while inherent body diodes (not shown) start conducting avalanche current as body voltage increases. This first embodiment includes a substrate 42 with a body layer 44 disposed over the substrate 42. The body layer 44 has a top surface 46 with a first diffusion area 48, a second diffusion area 50, and a first current collection area 52 between the first diffusion area 48 and the second diffusion area 50.

A plurality of first drain/source (D/S) diffusions 54 resides within the first diffusion area 48, and each one of the plurality of first drain/source (D/S) diffusions 54 is spaced apart from one another, parallel with one another, and elongated in an X-direction. A plurality of first channel regions 56 resides within the first diffusion area 48 such that each one of the plurality of first channel regions 56 resides between an adjacent pair of the plurality of the first D/S diffusions 54 and is elongated in the X-direction.

A plurality of second D/S diffusions 58 resides within the second diffusion area 50, and each one of the plurality of second D/S diffusions 58 is spaced apart from one another, parallel with one another, and elongated in the X-direction. A plurality of second channel regions 60 resides within the second diffusion area 50 such that each one of the plurality of second channel regions 60 resides between an adjacent pair of the plurality of the second D/S diffusions 58 and is elongated in the X-direction.

A first current collection diffusion 62 resides within the first current collection area 52 and is elongated in a Y-direction, which is orthogonal to the X-direction. The first current collection diffusion 62 is integral with both the plurality of first channel regions 56 and the plurality of second channel regions 60. In at least some embodiments, the plurality of first channel regions 56 and the plurality of second channel regions 60 have p– doping, and the plurality of first D/S diffusions 54 and the plurality of second D/S diffusions 58 have n+ doping. Moreover, in at least some of these embodiments, the first current collection diffusion 62 has p+ doping. Also, the exemplary embodiment of FIG. 3 includes a buried oxide (BOX) layer 64 that is disposed over the substrate 42 and resides between the substrate 42 and the body layer 44. Thus, the RF switch 40 is of the SOI type.

In this embodiment, the undesirably long distance W of the related-art RF SOI switch 10 of FIG. 2 is divided in half for the plurality of first channel regions 56 and the plurality of second channel regions 60. For example, the distance between a first proximal edge 66 and a first distal edge 68 of the plurality of first D/S diffusions 54 and the plurality of first channel regions 56 is W/2. Similarly, the distance between a second proximal edge 70 and a second distal edge 72 of the plurality of second D/S diffusions 58 and the plurality of second channel regions 60 is W/2. As a result of the first current collection diffusion 62 being between the first diffusion area 48 and the second diffusion area 50, resistances of the plurality of first channel regions 56 and resistances of the plurality of second channel regions 60 are in parallel. Thus, a total resistance for the plurality of first channel regions 56 and the plurality of second channel regions 60 is one-quarter the total resistance of the channel regions 24 of the related-art RF SOI switch 10 of FIG. 1 and FIG. 2.

Figure 4:
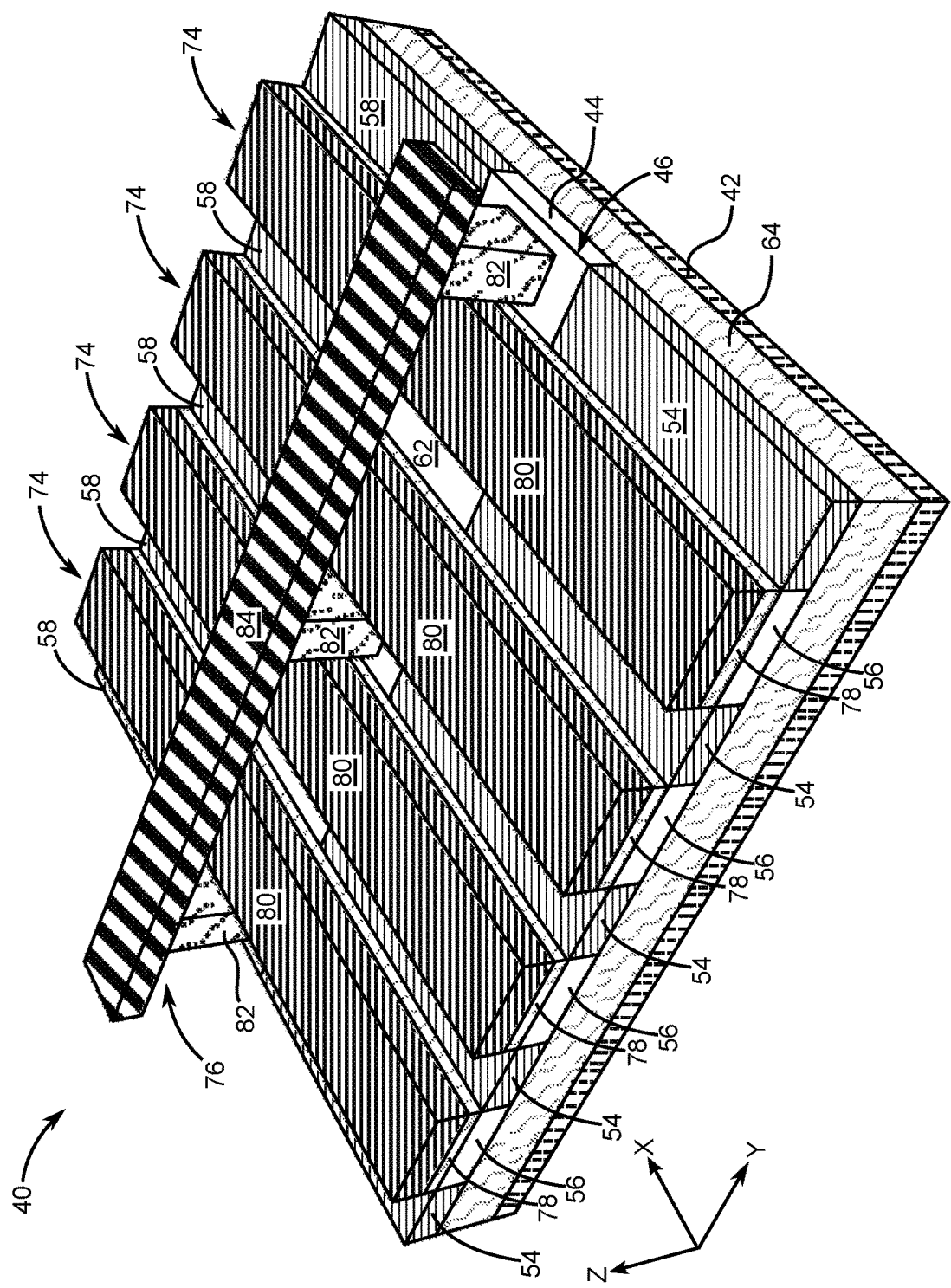
FIG. 4 is a 3D sectional view of the RF switch of FIG. 3 with gate structures and current collection structures added.

FIG. 4 is a 3D sectional view of the RF switch 40 of FIG. 3 with gate structures 74 and current collection structures 76 added. In this exemplary embodiment, the gate structures 74 include gate oxide strips 78 that are disposed over corresponding ones of the plurality of first channel regions 56 and the plurality of second channel regions 60 (as shown in FIG. 3). Moreover, in this exemplary embodiment, each of the gate oxide strips 78 extends across the first current collection diffusion 62 between longitudinally aligned ones of the plurality of first channel regions 56 and the plurality of second channel regions 60. Moreover, the gate structures 74 include gate fingers 80 that are disposed over corresponding ones of the gate oxide strips 78. The gate oxide strips 78 and the gate fingers 80 extend elongated in the X-direction.

The current collection structures 76 include a plurality of first electrically conductive contacts 82 that are in electrical contact with and spaced along the first current collection diffusion 62. In this exemplary embodiment, the plurality of first electrically conductive contacts 82 extends above the gate fingers 80 in a Z-direction from the first current collection area 52 (see FIG. 3), wherein the Z-direction is orthogonal to the X-direction and the Y-direction. A first metal strip 84 is in electrical contact with the tops of the plurality of first electrically conductive contacts 82. The first metal strip 84 extends elongated in the Y-direction.

In at least some embodiments, the RF switch 40 has a breakdown voltage between 100 V and 1000V. In some embodiments, the breakdown voltage of the RF switch 40 is between 100 V and 500 V, while in yet other embodiments, the breakdown voltage of the RF switch 40 is between 500 V and 1000 V.

Figure 5:
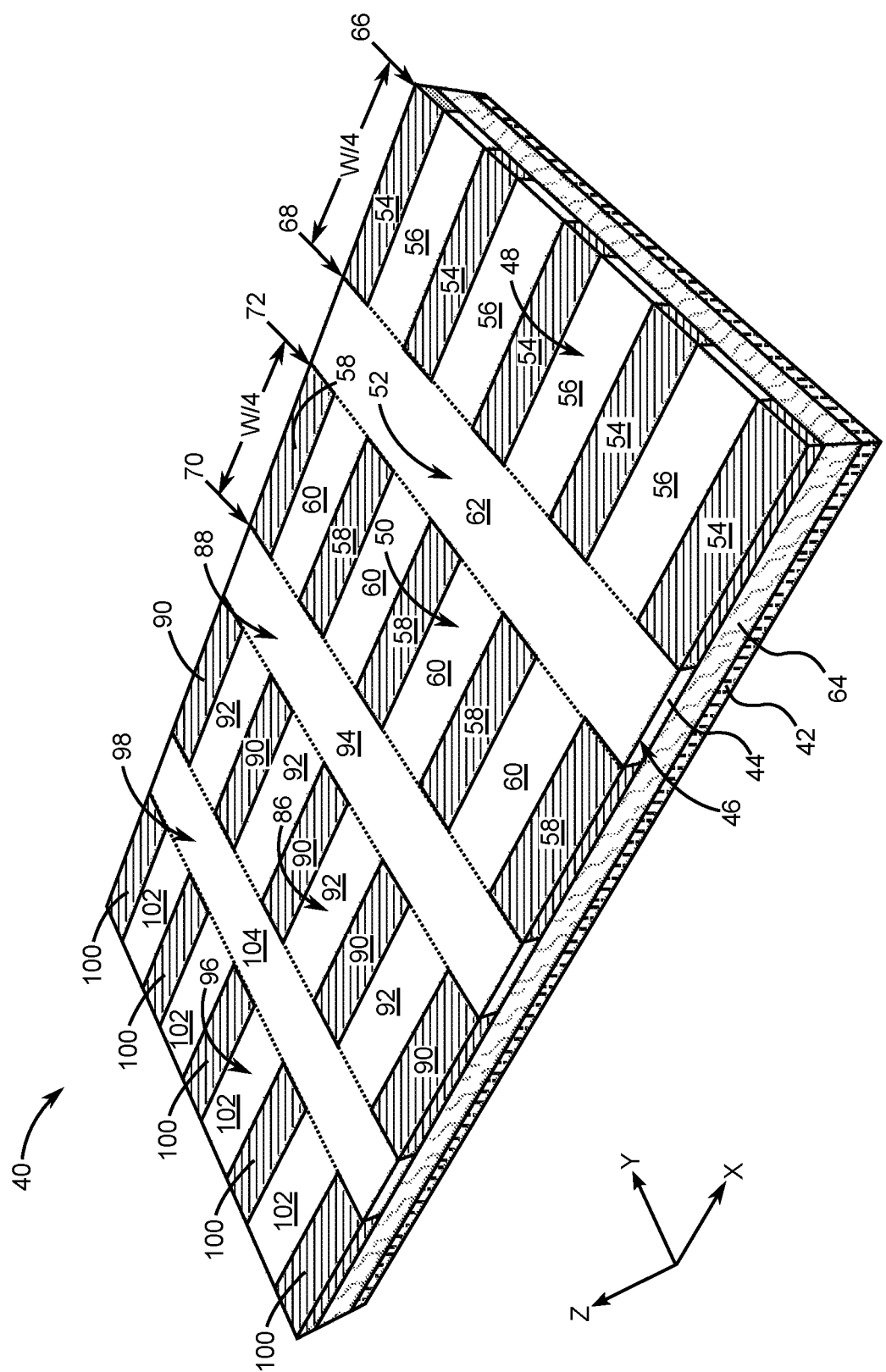
FIG. 5 is a 3D sectional view of a partially completed second embodiment of an RF switch that is structured in accordance with the present disclosure.

FIG. 5 is a 3D sectional view of a partially completed second embodiment of the RF switch 40 that is structured in accordance with the present disclosure. This second embodiment includes the substrate 42 with the body layer 44 disposed over the substrate 42. The body layer 44 has the top surface 46 with the first diffusion area 48, the second diffusion area 50, and the first current collection area 52 between the first diffusion area 48 and the second diffusion area 50.

The plurality of first D/S diffusions 54 resides within the first diffusion area 48, and each one of the plurality of first D/S diffusions 54 is spaced apart from one another, parallel with one another, and elongated in the X-direction. The plurality of first channel regions 56 resides within the first diffusion area 48 such that each one of the plurality of first channel regions 56 resides between an adjacent pair of the plurality of the first D/S diffusions 54 and is elongated in the X-direction.

The plurality of second D/S diffusions 58 resides within the second diffusion area 50, and each one of the plurality of second D/S diffusions 58 is spaced apart from one another, parallel with one another, and elongated in the X-direction. The plurality of second channel regions 60 resides within the second diffusion area 50 such that each one of the plurality of second channel regions 60 resides between an adjacent pair of the plurality of the second D/S diffusions 58 and is elongated in the X-direction.

The first current collection diffusion 62 resides within the first current collection area 52 and is elongated in a Y-direction, which is orthogonal to the X-direction. The first current collection diffusion 62 is integral with both the plurality of first channel regions 56 and the plurality of second channel regions 60. In at least some embodiments, the plurality of first channel regions 56 and the plurality of second channel regions 60 have p− doping, and the plurality of first D/S diffusions 54 and the plurality of second D/S diffusions 58 have n+ doping. Moreover, in at least some of these embodiments, the first current collection diffusion 62 has p+ doping. Also, the exemplary embodiment of FIG. 5 includes the buried oxide (BOX) layer 64 that is disposed over the substrate 42 and resides between the substrate 42 and the body layer 44. Thus, this second embodiment of the RF switch 40 is of the silicon-on-insulator (SOI) type.

In this embodiment, the undesirably long distance W of the related-art RF SOI switch of FIG. 2 is divided in quarters for the plurality of first channel regions 56 and the plurality of second channel regions 60. For example, in this second embodiment, the distance between a first proximal edge 66 and a first distal edge 68 of the plurality of first D/S diffusions 54 and the plurality of first channel regions 56 is W/4. Similarly, the distance between a second proximal edge 70 and a second distal edge 72 of the plurality of second D/S diffusions 58 and the plurality of second channel regions 60 is W/4.

The body layer 44 includes a third diffusion area 86 and a second current collection area 88 between the second diffusion area 50 and the third diffusion area 86. A plurality of third D/S diffusions 90 resides within the third diffusion area 86, and each one of the plurality of third D/S diffusions 90 is spaced apart from one another, parallel with one another, and elongated in the X-direction. A plurality of third channel regions 92 resides within the third diffusion area 86 such that each of the plurality of third channel regions 92 resides between an adjacent pair of the plurality of the third D/S diffusions 90 and is elongated in the X-direction.

A second current collection diffusion 94 resides within the second current collection area 88 and is elongated in a Y-direction, which is orthogonal to the X-direction. The second current collection diffusion 94 is integral with both the plurality of third channel regions 92 and the plurality of second channel regions 60. In at least some embodiments, the plurality of third channel regions 92 has p− doping and the plurality of third D/S diffusions 90 has n+ doping. Moreover, in at least some of these embodiments, the second current collection diffusion 94 has p+ doping.

The body layer 44 further includes a fourth diffusion area 96 and a third current collection area 98 between the third diffusion area 86 and the fourth diffusion area 96. A plurality of fourth D/S diffusions 100 resides within the fourth diffusion area 96, and each one of the plurality of fourth D/S diffusions 100 is spaced apart from one another, parallel with one another, and elongated in the X-direction. A plurality of fourth channel regions 102 resides within the fourth diffusion area 96 such that each one of the plurality of fourth channel regions 102 resides between an adjacent pair of the plurality of the fourth D/S diffusions 100 and is elongated in the X-direction.

A third current collection diffusion 104 resides within the third current collection area 98 and is elongated in a Y-direction, which is orthogonal to the X-direction. The third current collection diffusion 104 is integral with both the plurality of fourth channel regions 102 and the plurality of third channel regions 92. In at least some embodiments, the plurality of fourth channel regions 102 has p– doping and the plurality of the fourth D/S diffusions 100 has n+ doping. Moreover, in at least some of these embodiments, the third current collection diffusion 104 has p+ doping.

Figure 6:
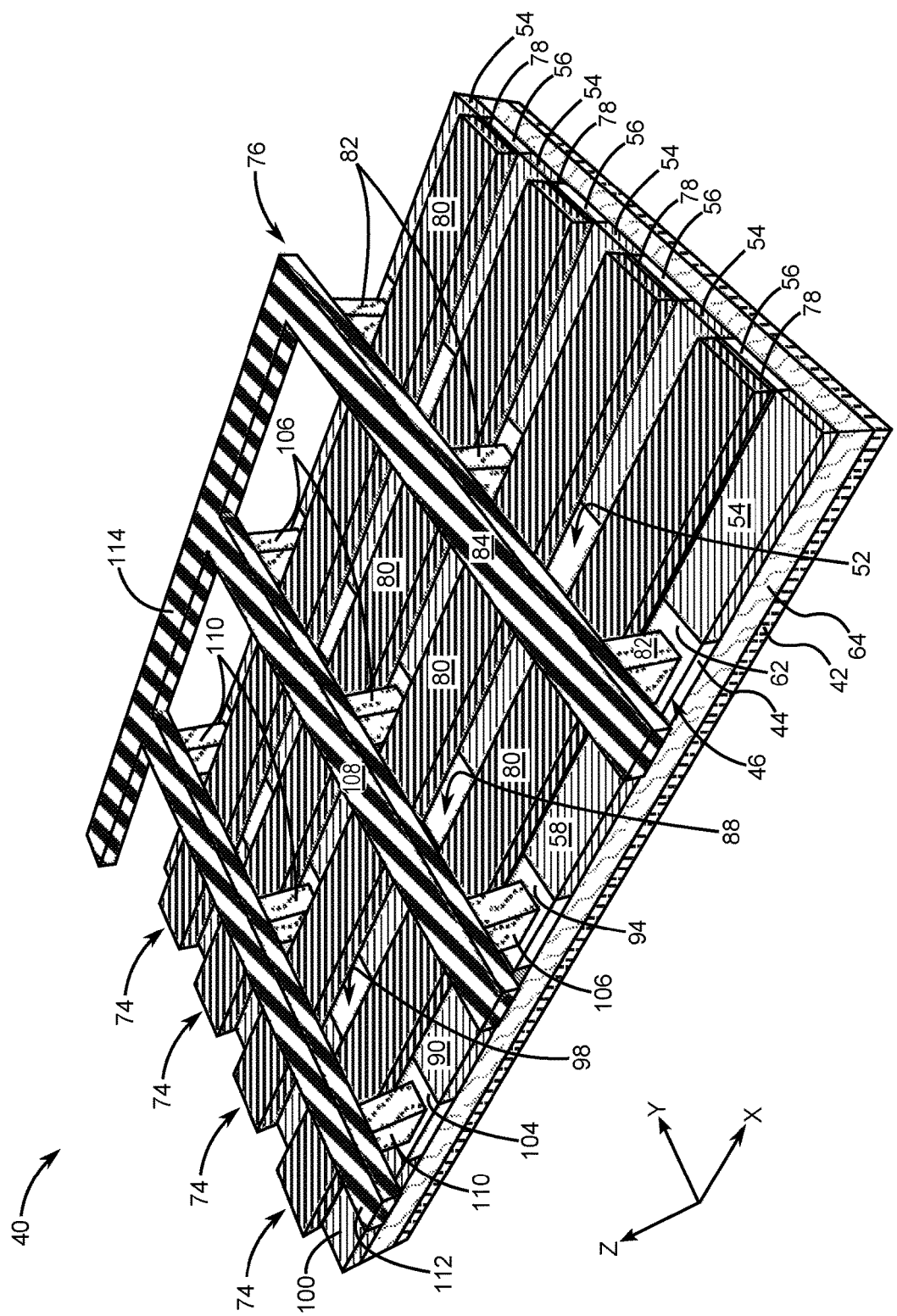
FIG. 6 is a 3D sectional view of the RF switch of FIG. 5 with gate structures and current collection structures added.

FIG. 6 is a 3D sectional view of the RF switch 40 of FIG. 5 with the gate structures 74 and the current collection structures 76 added. In this exemplary embodiment, the gate structures 74 include the gate oxide strips 78 that are disposed over corresponding ones of the plurality of first channel regions 56, the plurality of second channel regions 60, the plurality of the third channel regions 92, and the plurality of fourth channel regions 102. Moreover, in this exemplary embodiment, each of the gate oxide strips 78 extends across the first current collection diffusion 62, the second current collection diffusion 94, and the third current collection diffusion 104 between longitudinally aligned ones of the plurality of first channel regions 56 and the plurality of fourth channel regions 102. Moreover, the gate structures 74 include the gate fingers 80 that are disposed over corresponding ones of the gate oxide strips 78. The gate oxide strips 78 and the gate fingers 80 extend elongated in the X-direction.

The current collection structures 76 include the plurality of first electrically conductive contacts 82 that are in electrical contact with and spaced along the first current collection diffusion 62. In this exemplary embodiment, the plurality of first electrically conductive contacts 82 extend above the gate fingers 80 in a Z-direction from the first current collection area 52, wherein the Z-direction is orthogonal to the X-direction and the Y-direction. The first metal strip 84 is in electrical contact with the tops of the plurality of first electrically conductive contacts 82. The first metal strip 84 extends elongated in the Y-direction.

The current collection structures 76 also include a plurality of second electrically conductive contacts 106 that are in electrical contact with and spaced along the second current collection diffusion 94. In this exemplary embodiment, the plurality of second electrically conductive contacts 106 extends above the gate fingers 80 in a Z-direction from the second current collection area 88, wherein the Z-direction is orthogonal to the X-direction and the Y-direction. A second metal strip 108 is in electrical contact with the tops of the plurality of second electrically conductive contacts 106. The second metal strip 108 extends elongated in the Y-direction.

The current collection structures 76 further include a plurality of third electrically conductive contacts 110 that are in electrical contact with and spaced along the third current collection diffusion 104. In this exemplary embodiment, the plurality of third electrically conductive contacts 110 extends above the gate fingers 80 in a Z-direction from the third current collection area 98, wherein the Z-direction is orthogonal to the X-direction and the Y-direction. A third metal strip 112 is in electrical contact with tops of the plurality of third electrically conductive contacts 110. The third metal strip 112 extends elongated in the Y-direction. In this exemplary embodiment, a fourth metal strip 114 is electrically coupled to the first metal strip 84, the second metal strip 108, and the third metal strip 112. The fourth metal strip 114 extends elongated in the X-direction.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) switch comprising:
a substrate;
a body layer disposed over the substrate, wherein the body layer has a top surface with a first diffusion area, a second diffusion area, and a first current collection area between the first diffusion area and the second diffusion area;
a plurality of first drain/source (D/S) diffusions that resides within the first diffusion area and wherein each one of the plurality of first drain/source (D/S) diffusions is spaced apart from one another, parallel with one another, and elongated in an X-direction;
a plurality of first channel regions that resides within the first diffusion area such that each of the plurality of first channel regions resides between an adjacent pair of the plurality of first D/S diffusions and is elongated in the X-direction;
a plurality of second D/S diffusions that resides within the second diffusion area and wherein each one of the plurality of second D/S diffusions is spaced apart from one another, parallel with one another, and elongated in the X-direction;
a plurality of second channel regions that resides within the second diffusion area such that each of the plurality of second channel regions resides between an adjacent pair of the plurality of second D/S diffusions and is elongated in the X-direction; and
a first current collection diffusion that resides within the first current collection area and is elongated in a Y-direction, which is orthogonal to the X-direction.

2. The RF switch of claim 1 wherein the first current collection diffusion is integral with both the plurality of first channel regions and the plurality of second channel regions.

3. The RF switch of claim 1 wherein the plurality of first channel regions and the plurality of second channel regions have p– doping and the plurality of first D/S diffusions and the plurality of second D/S diffusions have n+ doping.

4. The RF switch of claim 3 wherein the first current collection diffusion has p+ doping.

5. The RF switch of claim 1 further comprising:
a plurality of first electrically conductive contacts are in electrical contact with and spaced along the first current collection diffusion;
a first metal strip that is in electrical contact with the tops of the plurality of first electrically conductive contacts such that the first metal strip extends elongated in the Y-direction.

6. The RF switch of claim 5 further comprising gate structures that reside over corresponding ones of the plurality of first channel regions and corresponding ones of the plurality of second channel regions, wherein the gate structures are elongated in the X-direction and pass under the first metal strip without making electrical contact with the plurality of first electrically conductive contacts and the first metal strip.

7. The RF switch of claim 6 wherein the plurality of first electrically conductive contacts extends above the gate structures in a Z-direction from the first current collection area, wherein the Z-direction is orthogonal to the X-direction and the Y-direction.

8. The RF switch of claim 7 wherein the gate structures comprise:
   gate oxide strips that are disposed over corresponding ones of the plurality of first channel regions and the plurality of second channel regions; and
   gate fingers that are disposed over corresponding ones of the gate oxide strips.

9. The RF switch of claim 5 further comprising:
   a third diffusion area within the top surface of the body layer; and
   a second current collection area within the top surface of the body layer, wherein the second current collection area is between the second diffusion area and the third diffusion area; and
   a second current collection diffusion that resides within the second current collection area and is elongated in a Y-direction, which is orthogonal to the X-direction.

10. The RF switch of claim 9 wherein the second current collection diffusion has p+ doping.

11. The RF switch of claim 9 further comprising:
    a plurality of third D/S diffusions that reside within the third diffusion area and are spaced apart from one another, parallel with one another, and elongated in the X-direction; and
    a plurality of third channel regions that reside within the third diffusion area such that each of the plurality of third channel regions resides between an adjacent pair of the plurality of third D/S diffusions and is elongated in the X-direction.

12. The RF switch of claim 11 further comprising:
    a plurality of second electrically conductive contacts that are in electrical contact with and spaced along the second current collection diffusion;
    a second metal strip that is in electrical contact with tops of the plurality of second electrically conductive contacts such that the second metal strip extends elongated in the Y-direction.

13. The RF switch of claim 12 further comprising gate structures that reside over corresponding ones of the plurality of first channel regions, corresponding ones of the plurality of second channel regions, and corresponding ones of the plurality of third channel regions, wherein the gate structures are elongated in the X-direction.

14. The RF switch of claim 13 wherein the gate structures pass under the first metal strip and the second metal strip without making electrical contact with the first metal strip, the plurality of first electrically conductive contacts, the second metal strip, and the plurality of second electrically conductive contacts.

15. The RF switch of claim 14 wherein the gate structures comprise:
    gate oxide strips that are disposed over corresponding ones of the plurality of first channel regions, the plurality of second channel regions, and the plurality of third channel regions; and
    gate fingers that are disposed over corresponding ones of the gate oxide strips.

16. The RF switch of claim 15 further comprising:
    a fourth diffusion area within the top surface of the body layer; and
    a third current collection area within the top surface of the body layer, wherein the third current collection area is between the third diffusion area and the fourth diffusion area; and
    a third current collection diffusion that resides within the third current collection area and is elongated in a Y-direction, which is orthogonal to the X-direction.

17. The RF switch of claim 16 wherein the third current collection diffusion has p+ doping.

18. The RF switch of claim 16 further comprising:
    a plurality of fourth D/S diffusions that reside within the fourth diffusion area and are spaced apart from one another, parallel with one another, and elongated in the X-direction; and
    a plurality of fourth channel regions that reside within the fourth diffusion area such that each of the plurality of fourth channel regions resides between an adjacent pair of the plurality of fourth D/S diffusions and is elongated in the X-direction.

19. The RF switch of claim 18 further comprising:
    a plurality of third electrically conductive contacts that are in electrical contact with and spaced along the third current collection diffusion;
    a third metal strip that is in electrical contact with tops of the plurality of third electrically conductive contacts such that the third metal strip extends elongated in the Y-direction.

20. The RF switch of claim 19 further comprising gate structures that reside over corresponding ones of the plurality of first channel regions, corresponding ones of the plurality of second channel regions, corresponding ones of the plurality of third channel regions, and corresponding ones of the plurality of fourth channel regions, wherein the gate structures are elongated in the X-direction.

21. The RF switch of claim 20 wherein the gate structures pass under the first metal strip, the second metal strip, and the third metal strip without making electrical contact with the first metal strip and the plurality of first electrically conductive contacts, the second metal strip and the plurality of second electrically conductive contacts, and the third metal strip and the plurality of the third electrically conductive contacts.

22. The RF switch of claim 21 wherein the gate structures comprise:
    gate oxide strips that are disposed over corresponding ones of the plurality of first channel regions, the plurality of second channel regions, the plurality of third channel regions, and the plurality of fourth channel regions; and
    gate fingers that are disposed over corresponding ones of the gate oxide strips.

23. The RF switch of claim 22 having a breakdown voltage between 100 V and 1000 V.

* * * * *